(12) United States Patent
Schmid et al.

(10) Patent No.: US 8,329,133 B2
(45) Date of Patent: Dec. 11, 2012

(54) METHOD AND APPARATUS FOR REFINING METALLURGICAL GRADE SILICON TO PRODUCE SOLAR GRADE SILICON

(75) Inventors: Frederick Schmid, Marblehead, MA (US); David B Joyce, Marblehead, MA (US)

(73) Assignee: GT Crystal Systems, LLC, Salem, MA (US)

( * ) Notice: Subject to any disclaimer, the term of this patent is extended or adjusted under 35 U.S.C. 154(b) by 0 days.

(21) Appl. No.: 12/607,773

(22) Filed: Oct. 28, 2009

(65) Prior Publication Data
US 2011/0217225 A1   Sep. 8, 2011

Related U.S. Application Data

(60) Provisional application No. 61/110,814, filed on Nov. 3, 2008.

(51) Int. Cl.
*C01B 33/02* (2006.01)

(52) U.S. Cl. .................................................. 423/348

(58) Field of Classification Search ........... 423/348–350
See application file for complete search history.

(56) References Cited

U.S. PATENT DOCUMENTS

| | | | |
|---|---|---|---|
| 3,322,503 A * | 5/1967 | Bloom et al. | 423/350 |
| 3,898,051 A | 8/1975 | Schmid | |
| 4,094,731 A | 6/1978 | Keyser et al. | |
| 4,124,410 A | 11/1978 | Kotval et al. | |
| 4,246,249 A | 1/1981 | Dawless | |
| 4,256,530 A | 3/1981 | Schmid et al. | |
| 4,256,717 A | 3/1981 | Dawless | |
| 4,539,194 A * | 9/1985 | Halvorsen | 423/348 |
| 4,798,659 A * | 1/1989 | Dosaj et al. | 204/164 |
| 4,840,699 A | 6/1989 | Khattak et al. | |
| 5,394,825 A | 3/1995 | Schmid et al. | |
| 5,438,973 A | 8/1995 | Schmid et al. | |
| 5,788,945 A | 8/1998 | Schei | |
| 5,842,462 A | 12/1998 | Schmid et al. | |
| 6,368,403 B1 | 4/2002 | Schmid et al. | |
| 7,344,596 B2 | 3/2008 | Schmid et al. | |
| 2007/0245854 A1 * | 10/2007 | Lynch et al. | 75/406 |
| 2007/0266826 A1 * | 11/2007 | Sanjurjo et al. | 75/367 |

FOREIGN PATENT DOCUMENTS

| | | |
|---|---|---|
| WO | 90/03952 | 4/1990 |
| WO | 2007/127126 | 8/2007 |
| WO | 2007127126 A2 | 11/2007 |
| WO | WO2008/035799 A1 | 3/2008 |

OTHER PUBLICATIONS

Ciftja et al. "Refining and Recycling of Silicon: A Review", Norwegian University of Science and Technology, Feb. 2008.*  Gribov et al., "Preparation of High-Purity Silicon for Solar Cells", Inorganic Materials, vol. 39, No. 7, 2003, pp. 653-662.*
Morita K et al: "Thermodynamics of solar-grade-silicon refining", Intermetallics, Elsevier Science Publishers B.V., GB, vol. 11, No. 11-12, Jan. 1, 2003, pp 1111-1117.

* cited by examiner

*Primary Examiner* — Colleen Dunn
*Assistant Examiner* — Anthony J Zimmer
(74) *Attorney, Agent, or Firm* — George A. Herbster

(57) ABSTRACT

A method and apparatus for refining metallurgical silicon to produce solar grade silicon for use in photovoltaic cells. A crucible in a vacuum furnace receives a mixture of metallurgical silicon and a reducing agent such as calcium disilicide. The mix is melted in non-oxidizing conditions within the furnace under an argon partial pressure. After melting, the argon partial pressure is decreased to produce boiling and the process ends with directional solidification. The process reduces impurities, such as phosphorus, to a level compatible with solar-grade silicon and reduces other impurities significantly.

15 Claims, 4 Drawing Sheets

| Element | MG Si Composition | MG3-169 Initial DS Composition | MG3-169 Last DS Composition | Composition Required for SoG Si Feedstock |
|---|---|---|---|---|
| Li |  | <0.05 | 0.013 |  |
| B | 19 | 7.0 | 6.3 | < 0.5 |
| F |  | <0.3 | <0.3 |  |
| Na | 0.7 | 0.22 | 0.033 |  |
| Mg | 0.2 | 0.007 | 0.19 |  |
| Al | 751.0 | 0.080 | 0.3 | < 0.5 |
| Si | Major | Major | Major |  |
| P | 26.2 | 0.51 | 0.13 | < 0.5 |
| S | 0.4 | <0.05 | 0.03 |  |
| Cl | 0.5 | 0.28 | 0.3 |  |
| K | 0.7 | 0.27 | 0.091 |  |
| Ca | 14.2 | 0.22 | 80 | < 5 |
| Sc | 0.5 |  |  |  |
| Ti | 169.4 | 0.076 | 12 | < 0.1 |
| V | 10.7 | <0.01 | 0.76 |  |
| Cr | 13.1 | <0.020 | 1.8 | < 0.1 |
| Mn | 84.0 | <0.05 | 0.048 | < 0.1 |
| Fe | 2617.0 | 4.3 | 640 | < 0.5 |
| Co | 4.6 | <0.01 | 1.1 |  |
| Ni | 11.8 | <0.05 | 3 | < 0.1 |
| Cu | 26.6 | <0.1 | 0.2 | < 0.1 |
| Zn | 0.2 | <0.1 | <0.1 |  |
| Ga |  | <0.1 |  |  |
| Ge | 3.4 | <0.5 | 1.4 |  |
| As | 0.3 | <0.2 | <0.03 |  |
| Se |  |  |  |  |
| Rb |  |  |  |  |
| Sr | 6.2 |  | 0.14 |  |
| Y | 0.8 |  | 0.045 |  |
| Zr | 7.3 | <0.05 | 0.086 |  |
| Nb | 0.7 | <0.05 | 0.016 |  |
| Mo | 1.8 | <0.05 | <0.01 | <0.05 |
| Ag |  |  |  |  |
| Cd |  |  |  |  |
| Sn | <0.1 | <0.2 | <0.1 |  |
| Sb | <0.1 | <0.2 | <0.1 |  |
| Ba | 0.3 | 0.34 | 20 |  |
| La | 3.5 | <0.1 | 0.22 |  |
| Ce | 8.3 | <0.1 | 0.31 |  |
| Pr | 1.1 |  |  |  |
| Nd | 3.4 |  | 0.14 |  |
| Sm | 0.4 |  |  |  |
| Eu | <0.05 |  |  |  |
| Gd | 0.5 |  |  |  |
| Tb | 0.1 |  |  |  |
| Dy | 0.5 |  |  |  |
| W | 0.6 | <0.1 | Composition |  |
| Pb | 0.0 | <0.05 | <0.05 |  |
| Bi | <0.01 | <0.03 | <0.03 |  |
| Th | 0.4 | <0.01 | <0.01 |  |
| U | 0.4 | <0.01 | <0.01 |  |

FIG. 4

METHOD AND APPARATUS FOR REFINING METALLURGICAL GRADE SILICON TO PRODUCE SOLAR GRADE SILICON

CROSS-REFERENCE TO RELATED APPLICATIONS

U.S. patent application Ser. No. 11/212,027 filed Aug. 25, 2005 by Frederick Schmid et al. for a System and Method for Crystal Growing, which application is assigned to the assignee of this invention, was granted as U.S. Pat. No. 7,344,596 on Mar. 18, 2008 and is incorporated herein by reference.

This application claims priority from U.S. Provisional Patent Application Ser. No. 61/110,814 filed Nov. 3, 2008.

BACKGROUND OF THE INVENTION

1. Field of the Invention

This invention relates to the production of silicon for use in solar cells and more particularly to a process for removing various impurities whereby metallurgic grade silicon can be refined to produce silicon for use in solar silicon photovoltaic cells.

2. Description of Related Art

It has long been an objective to convert solar energy into electricity. The leading candidate for implementing this technology is a direct conversion of solar energy to electricity by means of silicon photovoltaic cells. The technology has advanced to a level at which solar silicon photovoltaic cells are available that could provide a viable alternative source of electricity.

However, to date solar silicon photovoltaic cells are costly and are not yet available at a commercially economical basis for producing electricity competitively with the electric grid. Consequently solar energy systems remain too costly and, at present, do not constitute a cost-effective alternative to primary oil, coal, natural gas and propane power generating systems.

For purposes of understanding this invention, commercially available silicon is available in three forms or grades, each being characterized by different levels of impurities and manufacturing costs. Metallurgical grade silicon (hereinafter "MG-Si") has impurities in the range of 10,000 ppmw and has the least restrictive limits on impurities. It also is the least expensive to purchase, being available for about $3/kg at current prices. Electronic grade silicon (hereinafter "EG-Si") has the most restrictive limits on impurities, in the range of 1 ppbw. EG-Si therefore is also the most expensive to purchase. Selling prices for EG-Si in the past have been up to $150/kg; current selling prices can be up to triple that amount.

Solar silicon (hereinafter "SoG-Si") has impurity limits in the range of 1 ppmw and is currently available at a price of about $75 to $250/kg. In order for the solar energy systems to be commercially competitive alternative power sources for the electric grid, it is estimated that the cost for SoG-Si must be reduced significantly; e.g., to about $30/kg.

It now is recognized that boron, phosphorus, iron and aluminum are four impurities that present major obstacles to the efficient production of SoG-Si. Although there are yet no official standards, there seems to be a goal to produce silicon with impurities of boron, iron and phosphorus as follows:

TABLE 1

SoG-Si Impurity Targets

| IMPURITY | PPMW |
|---|---|
| B | <0.5 |
| P | <0.5 |
| Fe | <1.0 |
| Al | <0.5 |

One early proposal for producing SoG-Si is found in WO90/03952 to Schmid et al. that describes a method for growing silicon ingots using a rotating melt. The object of the invention is to produce photovoltaic grade silicon using the heat exchanger method. The disclosed method includes four processes, namely: (1) vaporization of impurities enhanced by vacuum operations in a silica crucible; (2) scavenging a reaction of impurities by slagging with silica and gas blowing with moist hydrogen and/or chlorine; (3) segregation of impurities enhanced by controlled directional solidification; and (4) centrifuging of insoluble particles. The system operates with a vacuum of less than 30 torr with a 0.1 torr vacuum being optimal. The resulting material is still expensive primarily because there are requirements for multiple production processes.

U.S. Pat. No. 4,094,731 discloses an apparatus and a process for producing silicon having a reduced iron concentration. The apparatus incorporates a carbon crucible, a carbon rod stirrer, a nitrogen gas injector and a ladle for decanting a mother liquor before the mixture reaches its eutectic temperature. Motion between a mold wall with the growing silicon crystals and the molten mother liquor continuously washes the exposed growing surfaces of the silicon crystals with the mother liquor. Canting the mother liquor before reaching the eutectic temperature leaves a hollow, ladle-shaped silicon ingot of about 60% of the weight of the original mother liquor and having outer and inner zones. The outer and inner zones are discarded to leave an annular crystalline portion with reduced iron concentration.

U.S. Pat. No. 4,124,410 discloses a process for reducing the level of iron and aluminum impurities. In this process essentially iron-free silicon platelets are precipitated from a solution of MG-Si in molten aluminum. The process next melts the refined platelets in contact with a silica slag and directionally solidifies the refined silicon-slag melt. One or more melts may be used to form a final product.

U.S. Pat. Nos. 4,246,240 and 4,256,717 disclose still another process for reducing iron impurities. This silicon purification process extracts heat from a molten silicon-rich material to provide a solid phase containing silicon in crystal form and a molten phase with concentrated impurities. The molten phase is separated from the solid phase. The solid phase is then remelted to remove the solvent metal, including impurities, from the crystals. At least one fraction of the remelted material is separated from the crystals. The metals or interest are tin, zinc, aluminum, silver and lead. This patent recognizes problems with removing phosphorous and proposes to reduce the level by treating the silicon rich alloy in the molten state with a source of chlorine, such as $Cl_2$, $COCl_2$ and $CCl_4$.

One general approach, as described in International Publication No. WO 2007/127126 filed by Lynch et al in 2006, is designed to remove boron and phosphorus during the conversion of MG-Si to EG-Si. Specifically, the Lynch reference describes a process by which aluminum and fluxing agents ($Al_2O_3$, $SiO_2$, CaO and MgO) are added to molten silicon to create an oxy-nitride slag. This slag is stated to act as a sink for dissolved boron and phosphorus. Nitrogen is bubbled through the molten silicon. Aluminum can be added as aluminum metal or as $Al_2O_3$. Normally, the silicon must initially be deoxidized to allow boron and phosphorus refining reactions to occur. The process may be followed by oxidative refining, SiC settling, the Silgrain process, and directional solidification to remove other impurities and produce silicon for use in solar cells. In an alternative version of the process, the molten silicon is passed through a particulate bed formed of a nitrogen-containing compound and an aluminum-containing compound.

To the extent that each of the foregoing processes may produce SoG-Si with acceptable levels of impurities, each is complex and expensive to implement. Consequently, the manufacturing cost for the SoG-Si material exceeds the price goal which would enable the production of commercially viable silicon for use in solar silicon photovoltaic cells. What is needed is a process that converts MG-Si into SoG-Si with a manufacturing cost that would enable a construction and operation of solar photovoltaic electricity generating systems to be a commercially viable alternative to conventional electrical energy delivered to the electric grid.

SUMMARY

Therefore, it is an object of this invention to provide a process for producing SoG-Si.

Another object of this invention is to provide a process for producing SoG-Si from MG-Si.

Yet another object of this invention is to provide a process for producing SoG-Si from MG-Si with acceptable levels of impurities.

Yet another object of this invention is to produce on a cost effective basis SoG-Si with acceptable levels of impurities.

In accordance with one aspect of this invention a process for refining metallurgical grade silicon in a reactor including a heat zone to remove impurities therefrom includes selecting a reducing compound for reducing at least one of the impurities and mixing the silicon with the selected reducing compound. Next the silicon and reducing compound mix is refined in a non-oxidizing environment under a reduced pressure and an elevated temperature. Thereafter the refined mix is cooled to promote directional solidification.

In accordance with another aspect of this invention apparatus for refining metallurgical grade silicon to remove impurities includes a crucible for receiving a mixture of metallurgical grade silicon and a reducing compound for at least one of the impurities. The crucible is placed in a reactor. Environment controls establish a non-oxidizing environment under reduced pressure in said reactor during the refining process. The refined material in the crucible is cooled undergoing directional solidification. Impurity segregation occurs during the refining and directional solidification.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 4 is a table that depicts the concentrations of impurities in silicon before and after one example of processing in accordance with this invention.

DESCRIPTION OF ILLUSTRATIVE EMBODIMENT

The genesis of this invention was an effort to define an economical process for reducing the level of phosphorus impurity in MG-Si ($\approx$26 ppmw) to one that would be satisfactory for SoG-Si applications (<1.0 ppmw). It was hypothesized that if a calcium-based reducing agent were to interact with phosphorus impurities in MG-Si, a gaseous phosphorus complex could be removed by vacuum. It was also theorized that the calcium must be in a non-oxidizing environment and non-oxidizing crucible in order to interact with impurities in MG-Si to achieve a satisfactory result. As will now be described, the apparatus and process of this invention did remove phosphorus impurities to a level that was lower than the SoG-Si requirement. The apparatus and process also removed other impurities significantly with many of the final impurities meeting the current requirements for commercially acceptable SoG-Si.

Figure 1:
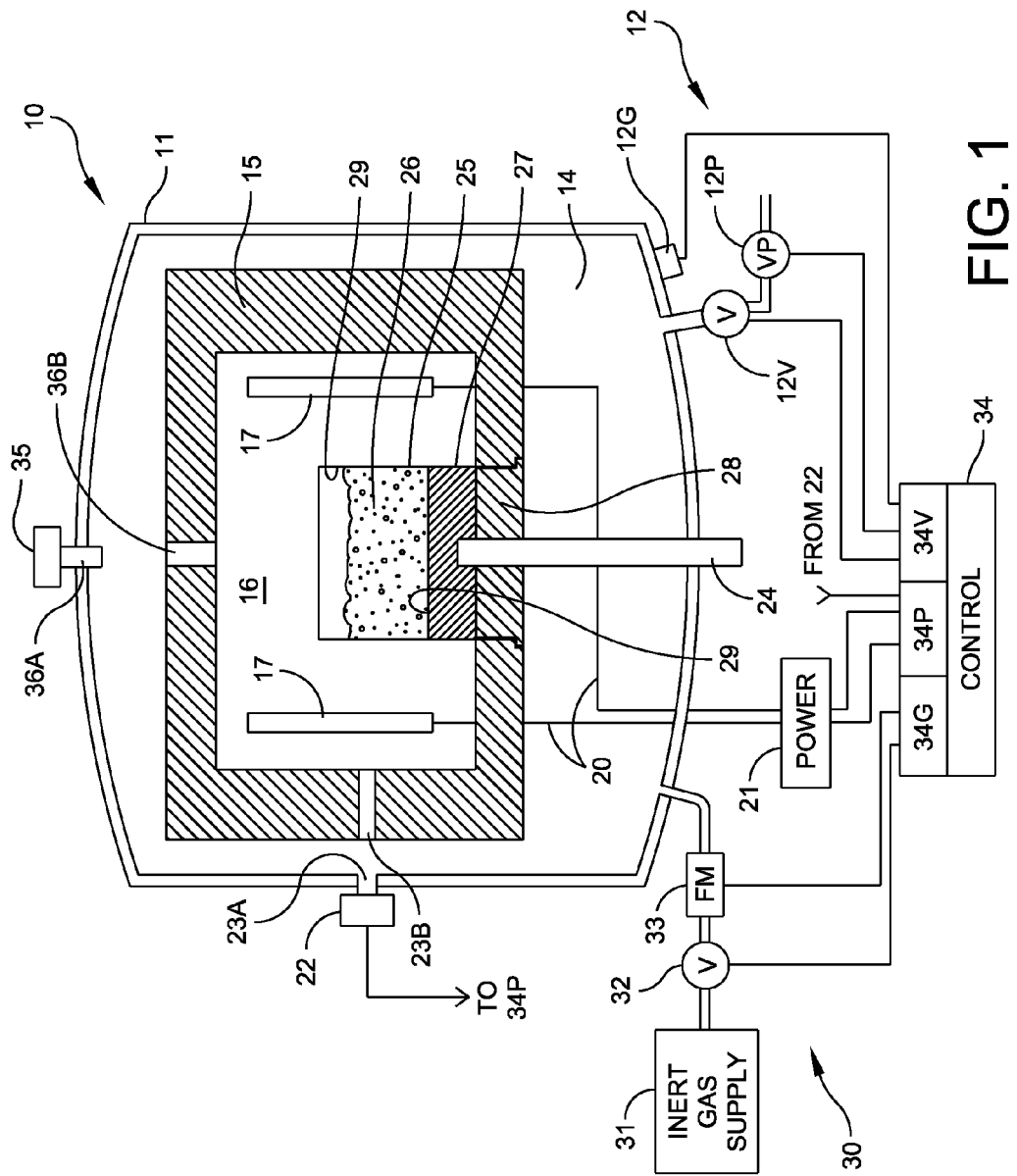
FIG. 1 is a block diagram of apparatus configured for implementing one portion of the process of this invention.

FIG. 1 depicts the apparatus or reactor 10 for performing the process. The reactor 10 includes a vacuum tight cylinder or vessel 11 that is a modification of the reactor shown in the above-identified U.S. Pat. No. 7,344,596. A vacuum pump assembly 12 evacuates the interior of the cylinder 11 and is shown schematically with a vacuum pump 12P, a vacuum gage 12G for providing measurements for vacuum control and a vacuum valve 12V.

The vacuum-tight chamber 11 supports a heat zone 16 by any of a number of known means or structures. In this embodiment insulation 15 forms the insulated heat zone 16 and is composed of a graphite-based material, such as graphite felt (gfelt).

The heat zone 16 includes a graphite resistance heater 17 with leads 20 that extend to a power source 21. At least one pyrometer 22 measures the process temperature through a window and port, such as window 23A and port 23B, to provide a temperature input signal for process control. A support rod 24 supports a graphite block 27 on which a properly constructed crucible 25 is seated. The crucible 25 contains a mix 26 of materials used in the refining process. The resistance heater 17 surrounds the crucible 25.

It is important that the crucible 25 be constructed so that it does not react with the oxides during the refining process. As a preferred alternative, the crucible 25 can be constructed of graphite or other suitable material with a protective liner 29 constructed of a non-oxide material. As another alternative, the crucible 25 could be constructed with a coating of a non-oxide material, such as a silicon nitride coating. As still another alternative, the entire crucible 25 could be constructed of a non-oxide material that also does not contaminate silicon.

Figure 3:
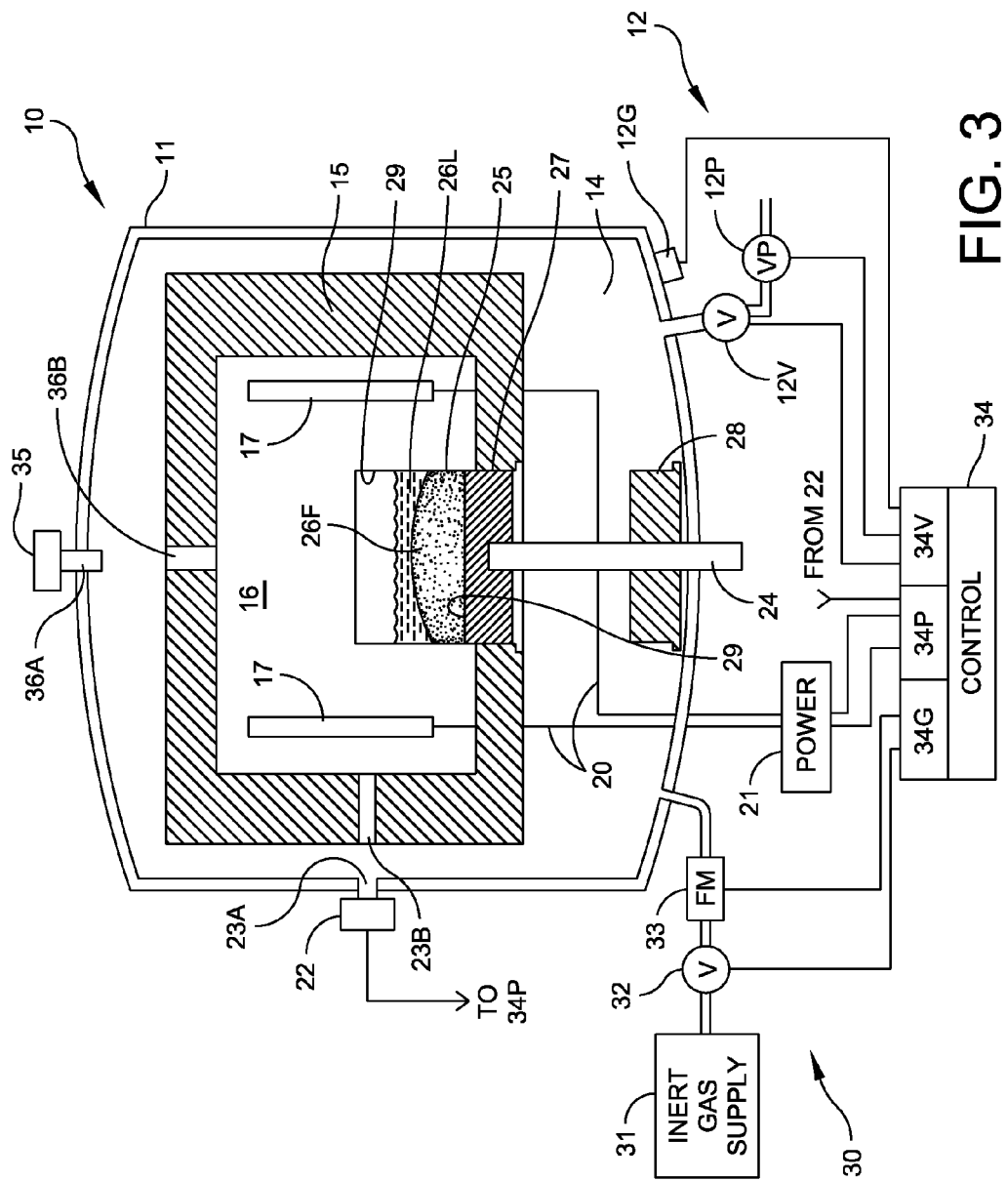
FIG. 3 is a block diagram of the apparatus in FIG. 1 configured for implementing another portion of the process of this invention.

The apparatus in FIG. 1 also includes a heat exchanger system including an insulating pack 28 that mounts to the support rod 24 and can move between the positions shown in FIGS. 1 and 3. Lowering the insulating pack 28 provides the capability for extracting heat directionally from the refined material for good directional solidification. That is, the heat exchanger system operates to produce temperature gradients in the liquid and the solid to form a convex interface to the liquid to grow columnar grains, which efficiently segregates impurities into the liquid at the solid-liquid interface.

In accordance with another aspect of this invention, an inert gas system 30 supplies inert gas into the volume defined by the vacuum tight container 11 including the cavity 16. The system includes a supply tank 31 or other source. A programmable valve 32 and flow meter 33 are used to control the gas flow rate into the reactor 10. The reactor 10 also includes a viewing port 35. This viewing port allows an operator to view the contents of the crucible 25 directly through windows 36A and port 36B. Such viewing ports are well known in the art.

Figure 2:
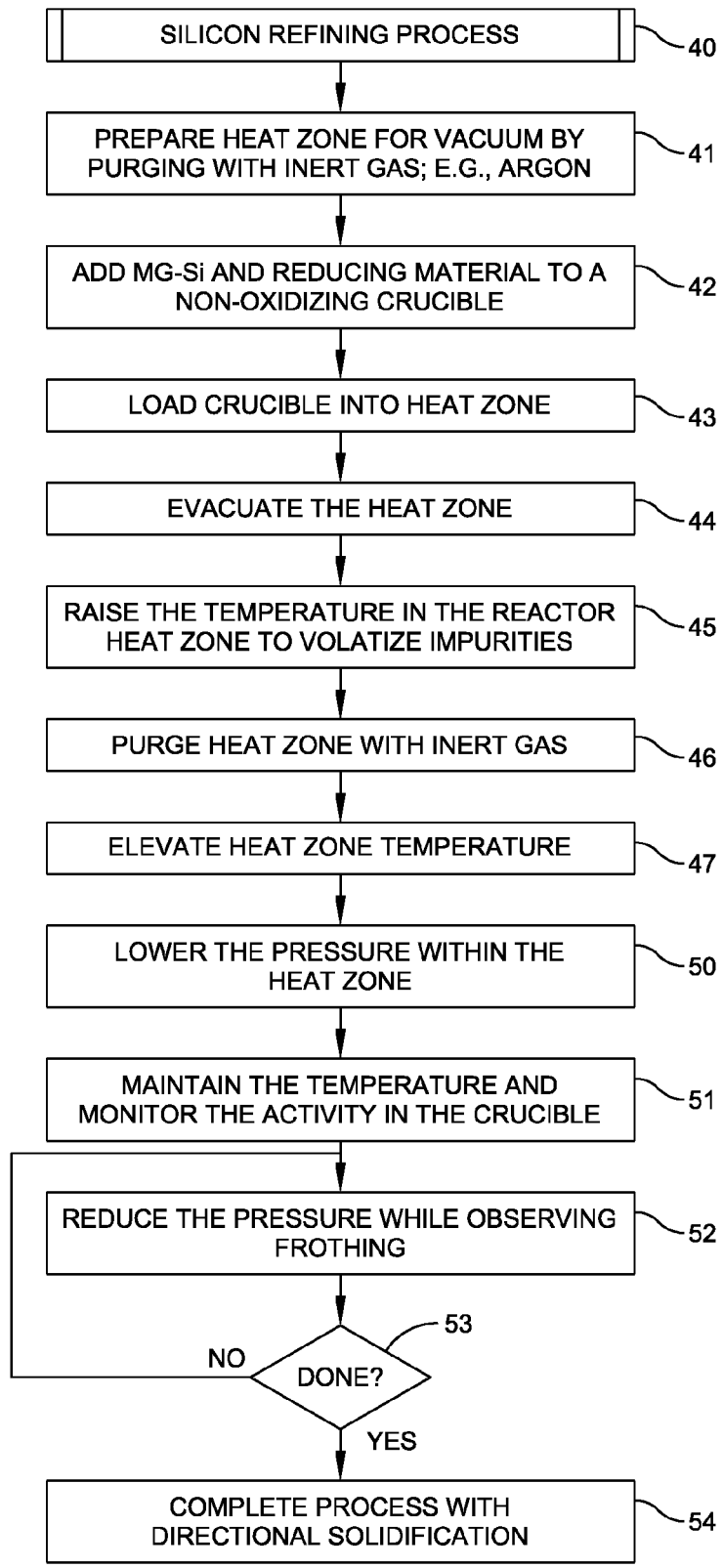
FIG. 2 is a flow chart of one embodiment of a process for implementing this invention.

A control 34 includes an interface 34V for the vacuum system, 34P for the power system and 34G for the inert gas system. Basically the control 34 monitors and controls the parameters of a refining process 40 as will now be described with respect to FIGS. 1 and 2.

Specifically, the silicon refining process 40 begins at step 41 by preparing the reactor 10 for operation in an inert environment and under vacuum. That is, steps are taken to minimize the possibility of interaction between calcium and any impurities in the reactor 10. For example, the reactor 10 is prepared by assuring that the crucible 25 and other components are clean. In step 42 the mix 26 of MG-Si and the selected reducing compound is added to the crucible 25 which then is loaded into the reactor 10 in step 43. At this time the insulating pack 28 will be raised to its upper position shown in FIG. 1.

Further conditioning occurs in steps 44 and 45. Step 44 energizes the vacuum system to first establish a vacuum level, and then the reactor 10 is purged with an inert gas such as argon to remove contaminants, such as water vapor, from the environment. The purging process is completed by evacuating the reactor 10 before the temperature in the heat zone is increased in step 45. Once the initial conditions have been established, step 46 causes the inert gas to backfill the reactor 10 to a pressure of 50 to 100 mbar and at a predetermined temperature of between 1100° C. and 1200° C. to prevent volatilization of the calcium disilicide.

Next, in step 47 the control 34 elevates the temperature above the melting point of the mix 26 in a controlled manner. Once the contents in the crucible 25 have melted, step 50 begins to reduce the pressure in a controlled manner until bubbling of the liquid in the crucible 25 is observed, as depicted in FIG. 1. During step 51 the control system 40 maintains the temperature above the melting point while monitoring the bubbling activity or frothing that indicates the existence of a volatile reaction. Step 52 begins to reduce the pressure (i.e., increase the vacuum) while maintaining a constant bubbling or frothing rate. This process continues until the frothing action terminates indicating the end of the volatile reaction. At some time thereafter, step 53 transfers control to step 54 whereby the insulating pack 28 is lowered at a controlled rate to provide directional solidification of the liquid contents in the crucible 25 as previously described and as depicted in FIG. 4.

EXAMPLE

In this example, a MG-Si composition, as defined in FIG. 4 was refined using calcium disilicide ($CaSi_2$) as the calcium-based reducing agent. Step 41 prepared the reactor 10 by removing any contaminants in the heat zone 16.

In step 42, the crucible 25 was loaded with 300 grams of MG-Si having the impurity elements as shown in column A of FIG. 4 and with calcium disilicide ($CaSi_2$) to 25% by weight of the silicon. After loading the crucible 25 into the reactor in step 43, the vacuum pump 12 was energized in step 44 to evacuate the reactor 10 to about 0.032 mbar. Step 45 caused the resistance heater 17 to elevate the temperature to 1170° C., and then step 46 enabled the gas supply 31 to backfill the reactor 10 with an inert gas. In this example, argon was selected to backfill the reactor to about 60 mbar.

When these conditions were reached, the control 34 in step 47 elevated the temperature of the heat zone 16 to 1473° C. to melt the crucible contents. Then step 50 slowly reduced the pressure in the reactor 10. Using the observations of step 51, it was found that reducing the pressure at a controlled rate of about 0.002 mbar/min. in step 52 controlled bubbling in the crucible 25.

Once the contents of the crucible became quiescent after about 1.5 hours, the pressure was reduced to about 0.374 mbar. More specifically, the control 34 increased the temperature to about 1500° C. while the pressure continued to be reduced. After about 14.5 hours the pressure had been reduced to 0.106 mbar. When the process was completed, step 53 diverted operations to step 54 whereupon the insulating pack 28 and the block were lowered to the position shown in FIG. 3 to initiate directional solidification of the crucible contents.

FIG. 4 depicts the results of an analysis of the silicon produced in Example 1. Specifically, FIG. 4 presents an element (Column A) and the concentration of that element in the MG-Si (Column B) prior to processing. Generally speaking, the level of impurities of boron (B), aluminum (Al), sulfur (S), chlorine (Cl), potassium (K), titanium (Ti), vanadium (V), chromium (Cr), manganese (Mn), iron (Fe), cobalt (Co), nickel (Ni), copper (Cu), zinc (Zn), germanium (Ge), arsenic (As), yttrium (Y), zirconium (Zr), niobium (Nb), lanthanum (La), calcium (Ca) and neodymium (Nd) were reduced as shown in Columns C and D, so that the concentrations of many elements shown in Column C were below the requirements of Column E.

During directional solidification, the lowest or bottom material in the crucible freezes first; this is designated by reference 26F in FIG. 3. As the material progressively freezes upward, impurities segregate into the liquid 26L. When the directional solidification step is complete, the concentration of impurities in the top, or "last-to-freeze," portion (Column D) should be greater than the concentration of impurities in the bottom, or "first-to-freeze," portion (Column C), so long as impurities are not removed from the liquid during solidification. For example, for iron concentration in the "first-to-freeze" silicon is 4.3 ppmw, considerably lower than the concentration of 640 ppmw in the "last-to-freeze" silicon, which is well below the starting concentration of 2,617 ppmw. Iron segregation is very high in silicon and the concentration in the last material to freeze should be greater than 2617 ppmw in the starting silicon due to segregation to the last silicon to freeze. Therefore, clearly iron was removed from the silicon during the refining process.

A number of elements did follow this pattern. For example, phosphorus had an initial concentration of 26.2 ppmw (Column B) and final concentrations of 0.51 ppmw and 0.13 ppmw in the "first-to-freeze " and "last-to-freeze" samples shown in Columns C and D, respectively. These values do not account for all the phosphorus in the original material. Boron, aluminum, magnesium, chlorine, titanium, vanadium, chrome, manganese, cobalt, nickel, copper, zinc, germanium, arsenic, strontium, zirconium, niobium, molybdenum, lanthanum, cerium, neodymium, uranium, sodium and potassium also were removed as a result of the refining process. Stated generally, the total levels of these impurities in the refined silicon were less than those in the original silicon. It is therefore hypothesized that the combination of melting in a non-oxidizing environment defined by the graphite crucible and argon gas and in a vacuum in the presence of calcium disilicide ($CaSi_2$) caused these impurities to be removed by gettering from Mg—Si.

As will now be apparent, the refining process of this invention produced silicon that has a significantly reduced level of impurities from those originally found in MG-Si. As will also be apparent, the processing involves readily available materials and a process that is simpler and less costly than proposed in the prior art. While not all the impurities in the above-example met the current requirements for SoG-Si, it appears that process variations can produce a final product that will meet the current requirements. Such variations include, for example, altering the initial ratio of reducing material to MG-Si and/or increasing the ratio during the refining process and/or using different reducing materials, and/or reducing the pressure during processing, and/or increasing the process time at reduced pressure. Still another variation is to reprocess the contents to produce meltstock or ingots. Another approach is to remove the last-to-freeze portion of the material provided by the example and then reprocess the remainder of the silicon to produce meltstock or ingots. Thus, this invention holds the promise for providing SoG-Si at the price point that will be lower than current refining processes.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A process for refining metallurgical grade silicon in a reactor including a heat zone and means for controlling the temperature and pressure in the reactor, said process reducing the levels of impurities including at least one of phosphorus and boron impurities in the metallurgical grade silicon and comprising the steps of:
   A) selecting a calcium-based agent for reducing a level of the at least one of the phosphorous and boron impurities,
   B) loading the silicon and the selected agent into a crucible to produce a mixture,
   C) placing the loaded crucible into the reactor heat zone,
   D) refining the mixture of the silicon and the selected agent by elevating the temperature in the reactor heat zone to at least the melting point for the mixture in a non-oxidizing environment at a pressure of 50-100 bar, and then further reducing the pressure in the reactor heat zone to cause and control bubbling in the melted mixture thereby to produce a melted refined material, and
   E) thereafter directionally solidifying the melted refined material produced in step D) in the same crucible and reactor thereby to segregate impurities during said directional solidification whereupon there is produced silicon with reduced levels of impurities including the at least one impurity of phosphorus and boron.

2. A process as recited in claim 1 wherein said selection of an agent includes selecting calcium disilicide as the agent.

3. A process as recited in claim 1 wherein said refining includes, as an initial step, properly conditioning the reactor and crucible to prevent interactions between the selected agent and any impurities in the heat zone.

4. A process as recited in claim 3 wherein said conditioning includes evacuating the heat zone and elevating the heat zone temperature.

5. A process as recited in claim 3 wherein said refining includes the step of purging the heat zone with an inert gas after said conditioning.

6. A process as recited in claim 3 wherein said refining includes the step of purging the heat zone by backfilling of the heat zone with argon.

7. A process as recited in claim 6 wherein said step of directionally solidifying includes cooling.

8. A process as recited in claim 1 wherein the metallurgical silicon additionally includes aluminum as an impurity and said selection of a calcium-based agent includes selecting calcium disilicide as the agent.

9. A process as recited in claim 1 wherein said directional solidification segregates impurities which are found in the last material to freeze.

10. A process as recited in claim 1 wherein the metallurgical silicon includes titanium impurities.

11. A process as recited in claim 3 wherein said refining includes the step of purging the heat zone with an inert gas after said conditioning by backfilling the heat zone with an inert gas to increase the pressure before increasing the temperature above the melting point of the mixture of the metallurgical silicon and the selected agent.

12. A process as recited in claim 3 wherein said refining includes the step of purging the heat zone after said conditioning by backfilling the heat zone with argon to increase the pressure before increasing the temperature above the melting point of the mixture of the metallurgical silicon and the selected agent.

13. A process for refining metallurgical grade silicon that includes at least one impurity of phosphorous, boron or aluminum, said process occurring in a reactor including a heat zone and means for controlling the temperature and pressure in the reactor and including the steps of:
   A) mixing the silicon with calcium disilicide,
   B) refining the mixed silicon and calcium disilicide in the reactor in a non-oxidizing environment at an elevated temperature that melts the silicon and at a reduced pressure that causes and controls bubbling due to volatilization of the calcium disilicide whereby during volatilization under the reduced pressure impurities are removed from the mix thereby to produce a refined material; and
   C) upon quiescence of the mix in step B) directionally solidifying the refined material in the same reactor thereby to segregate impurities from the refined material.

14. A process for refining metallurgical grade silicon in a reactor that includes a heat zone and means for controlling the temperature and pressure in the reactor to remove a plurality of impurities including phosphorous from the metallurgical grade silicon and comprising the steps of:
   A) loading the silicon and calcium disilicide into a crucible to produce a mixture,
   B) placing the loaded crucible into the reactor heat zone,
   C) refining the mixture of the silicon and calcium disilicide by elevating the temperature in the reactor heat zone to at least the melting point for the mixture in a non-oxidizing environment at a pressure of 50-100 bar, and then further reducing the pressure in the reactor heat zone to produce a melted refined material, and
   D) thereafter directionally solidifying the melted refined material produced in step C) in the same crucible and reactor thereby to segregate impurities during said directional solidification whereupon there is produced silicon with reduced levels of phosphorus.

15. A process for refining metallurgical grade silicon in a reactor that includes a heat zone and means for controlling the temperature and pressure in the reactor to remove a plurality of impurities including phosphorous, boron and aluminum as impurities from the metallurgical grade silicon and comprising the steps of:
A) loading the silicon and calcium disilicide into a crucible to produce a mixture,
B) placing the loaded crucible into the reactor heat zone,
C) refining the mixture of the silicon and calcium disilicide by elevating the temperature in the reactor heat zone to at least the melting point for the mixture in a non-oxidizing environment at a pressure of 50-100 bar and then further reducing the pressure in the reactor heat zone to produce a melted refined material, and
D) thereafter directionally solidifying the melted refined material produced in step C) in the same crucible and reactor thereby to segregate impurities during said directional solidification whereupon there is produced silicon with reduced levels of phosphorus, boron and aluminum.

* * * * *